United States Patent
Zoelle

(10) Patent No.: US 9,680,443 B2
(45) Date of Patent: Jun. 13, 2017

(54) APPARATUS AND METHOD FOR OPERATING AT LEAST TWO ANTENNAS FOR A MOTOR VEHICLE, AND NEAR-FIELD COMMUNICATION NETWORK

(71) Applicant: CONTI TEMIC MICROELECTRONIC GMBH, Nuremberg (DE)

(72) Inventor: Thomas Zoelle, Constance (DE)

(73) Assignee: Conti Temic Microelectronic GmbH, Nuremberg (DE)

( * ) Notice: Subject to any disclaimer, the term of this patent is extended or adjusted under 35 U.S.C. 154(b) by 0 days.

(21) Appl. No.: 14/820,713

(22) Filed: Aug. 7, 2015

(65) Prior Publication Data

US 2016/0056788 A1   Feb. 25, 2016

(30) Foreign Application Priority Data

Aug. 20, 2014  (DE) .................... 10 2014 216 539

(51) Int. Cl.
*H04B 5/00*  (2006.01)
*H03H 7/40*  (2006.01)
(Continued)

(52) U.S. Cl.
CPC .............. *H03H 7/40* (2013.01); *H01Q 1/32* (2013.01); *H01Q 1/3208* (2013.01); *H01Q 3/24* (2013.01); *H01Q 7/00* (2013.01); *H04B 5/0012* (2013.01); *H04B 5/0025* (2013.01); *H04B 5/0062* (2013.01); *H04W 4/008* (2013.01); *H03H 7/427* (2013.01)

(58) Field of Classification Search
CPC .......... H01Q 7/00; H01Q 1/2216; H01Q 1/32; H01Q 1/243; H01Q 1/3208; H01Q 1/3233; H01Q 1/50; H01Q 21/28; H01Q 3/24; H04B 5/0012; H04B 5/0062; H04B 5/0025; H04B 5/0087
See application file for complete search history.

(56) References Cited

U.S. PATENT DOCUMENTS 5,047,674 A    9/1991  Clark et al.
2008/0238679 A1*  10/2008  Rofougaran ......... G06K 7/0008
340/572.2

(Continued)

FOREIGN PATENT DOCUMENTS

WO   2013087198 A1   6/2013

*Primary Examiner* — Golam Sorowar
(74) *Attorney, Agent, or Firm* — Laurence A. Greenberg; Werner H. Stemer; Ralph E. Locher

(57) ABSTRACT

An apparatus for operating at least two antennas for a motor vehicle. The apparatus has a switching device to be coupled to the at least two antennas and to perform at least one switching process for changing a respective input capacitance of one antenna of the at least two antennas. A multiplexing device is configured to select one of the at least two antennas for near field communication and to connect it to an output. The multiplexing device and the switching device are configured, when changing over from a first antenna having a first input capacitance to a second antenna having a second input capacitance, to match the second input capacitance to the first input capacitance by performing the switching process.

10 Claims, 3 Drawing Sheets

(51) Int. Cl.
   *H01Q 1/32*     (2006.01)
   *H04W 4/00*     (2009.01)
   *H01Q 3/24*     (2006.01)
   *H01Q 7/00*     (2006.01)
   *H03H 7/42*     (2006.01)

(56) References Cited

U.S. PATENT DOCUMENTS

2013/0002033 A1* 1/2013 Fuchs ................. H01Q 1/2216
                                                     307/104
2013/0342421 A1* 12/2013 Katz ........................ H01Q 1/50
                                                     343/852
2014/0320375 A1* 10/2014 Kessler ............... H01Q 1/2216
                                                     343/860

* cited by examiner

APPARATUS AND METHOD FOR OPERATING AT LEAST TWO ANTENNAS FOR A MOTOR VEHICLE, AND NEAR-FIELD COMMUNICATION NETWORK

CROSS-REFERENCE TO RELATED APPLICATION

This application claims the priority, under 35 U.S.C. §119, of German patent application DE 10 2014 216 539.3, filed Aug. 20, 2014; the prior application is herewith incorporated by reference in its entirety.

BACKGROUND OF THE INVENTION

Field of the Invention

The present invention relates to an apparatus and a method for operating at least two antennas for a motor vehicle.

Near field communication, NFC for short, is a transmission standard for the contactless interchange of data using radio technology over distances in the region of centimeters at a data transmission rate of up to 424 kbit/s for example.

It is generally known that this technology is used primarily in solutions for micro payment—cashless payment of small sums.

The transmission takes place either without connections, using passive RF RFID tags, radio-frequency RFID (radio-frequency identification, identification by means of electromagnetic waves), according to ISO 14443 or ISO 15693, or with connections between equivalent active transmitters.

SUMMARY OF THE INVENTION

It is an object of the present invention to provide a method and an apparatus for the improved operation of antennas.

With the foregoing and other objects in view there is provided, in accordance with the invention, an apparatus for operating at least two antennas for a motor vehicle, the apparatus comprising:

a switching device to be coupled to the at least two antennas and configured to perform a switching process and to use the switching process to change a respective input capacitance of one antenna of the at least two antennas;

a multiplexing device connected to said switching device, said multiplexing device being configured to select one of the at least two antennas for near field communication and to connect the selected antenna to an output; and said multiplexing device and said switching device being configured, when changing over from a first antenna having a first input capacitance to a second antenna having a second input capacitance, to match the second input capacitance to the first input capacitance by performing the switching process.

In other words, a first aspect of the present invention relates to an apparatus for operating at least two antennas for a motor vehicle, wherein the apparatus comprises: a switching device that is designed to be coupled to the at least two antennas and to perform at least one switching process and to use the switching process to change a respective input capacitance of one antenna from the at least two antennas; and a multiplexing device that is designed to select one of the at least two antennas for near field communication and to connect it to an output of the apparatus; wherein the multiplexing device and the switching device are designed so that, when changing over from a first antenna having a first input capacitance to a second antenna having a second input capacitance, they match the second input capacitance to the first input capacitance by performing the switching process.

According to a further aspect of the present invention, a near field communication network for a motor vehicle is provided, wherein the near field communication network comprises at least two antennas and an apparatus according to the first aspect of the present invention or according to any embodiment of the first aspect of the present invention.

With the above and other objects in view there is also provided, in accordance with the invention, a method of operating at least two antennas of a motor vehicle. The novel method comprises the following method steps:

providing a first antenna from the at least two antennas as a currently connected antenna, the first antenna having a first input capacitance;

selecting a second antenna from the at least two antennas as the antenna to be imminently connected; and performing a switching process, wherein a second input capacitance of the second antenna is matched to the first input capacitance of the first antenna, and effecting a changeover from the first antenna to the second antenna.

According to this further aspect of the present invention, a method for operating at least two antennas for a motor vehicle is provided, wherein the method comprises the following method steps: provision of a first antenna from the at least two antennas as the currently connected antenna, wherein the first antenna has a first input capacitance; selection of a second antenna from the at least two antennas as the imminently connected antenna; and performance of a switching process, wherein a second input capacitance of the second antenna is matched to the first input capacitance of the first antenna, and changeover from the first antenna to the second antenna is performed.

The term first input capacitance or second input capacitance or third input capacitance of a first, second or third antenna, as used by the present invention, means an input capacitance that is prevalent to now or at present in a respective antenna.

By way of example, the first input capacitance can assume different values depending on the switching process being performed. By way of example, an input capacitance, for example the first input capacitance or the second input capacitance, can be formed from a total of two series capacitances, with a switching process being able to set one of the series capacitances to 0 F, which changes the associated input capacitance of the respective antenna accordingly.

Advantageously, the present invention allows the input capacitance to be changed on initiation by an external switching process and therefore allows the input capacitance of an antenna to be advantageously adjusted when an antenna is changed over to a next antenna in a multiplexing mode of the antennas.

Advantageously, the present invention allows the emission or reception of electromagnetic waves to be improved for a motor vehicle, i.e. for example during the journey or during motion at 50 km/h for example, the electromagnetic waves being able to be emitted or received by virtue of the operation of a plurality of—at least two—antennas.

In this case, the antennas used for wireless communication to the motor vehicle or from the motor vehicle, for example, can be controlled by an electronic supplementary device in the motor vehicle.

By way of example, door opening or closure for a vehicle door on a motor vehicle can be realized by a near field communication network for a motor vehicle.

Transmission or reception devices of the near field communication network can have at least two antennas. In this case, it is possible to use an apparatus for operating at least two antennas for a motor vehicle.

By way of example, the data interchanged via the near field communication network are used to authenticate a person, for example the driver, the system for door opening or closure releases the lock on the vehicle door and pulling the handle opens the vehicle door.

Advantageous refinements of the present invention are characterized in the sub claims.

In accordance with an added feature of the invention, the switching device has a bipolar transistor. This advantageously allows the provision of a safe and simple design for the switching apparatus.

In accordance with an additional feature of the invention, the switching device is designed to connect a series capacitance of one of the at least two antennas to ground as the switching process that is to be performed. This advantageously allows an input capacitance of an antenna to be changed in a simple manner.

In accordance with a further advantageous feature of the invention, the apparatus additionally has a near field communication base station that is configured to operate the at least two antennas on a transceiver.

In accordance with another feature of the invention, the apparatus is configured to operate the at least two antennas for near field communication in a frequency range from 10 to 20 MHz, preferably from 12 to 17 MHz, particularly preferably from 13.56 to 15.5 MHz.

In accordance with a concomitant feature of the invention, the apparatus additionally has a matching network that is designed to be coupled to the at least two antennas. This advantageously allows an input capacitance of an antenna to be changed in a simple manner.

The refinements and developments described can be combined with one another as desired.

Although the invention is illustrated and described herein as embodied in an apparatus and method for operating at least two antennas for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

In the figures of the drawings, the same reference symbols denote elements, parts, components or method steps that are structurally or functionally equal, unless indicated to the contrary.

DETAILED DESCRIPTION OF THE INVENTION

Figure 1:
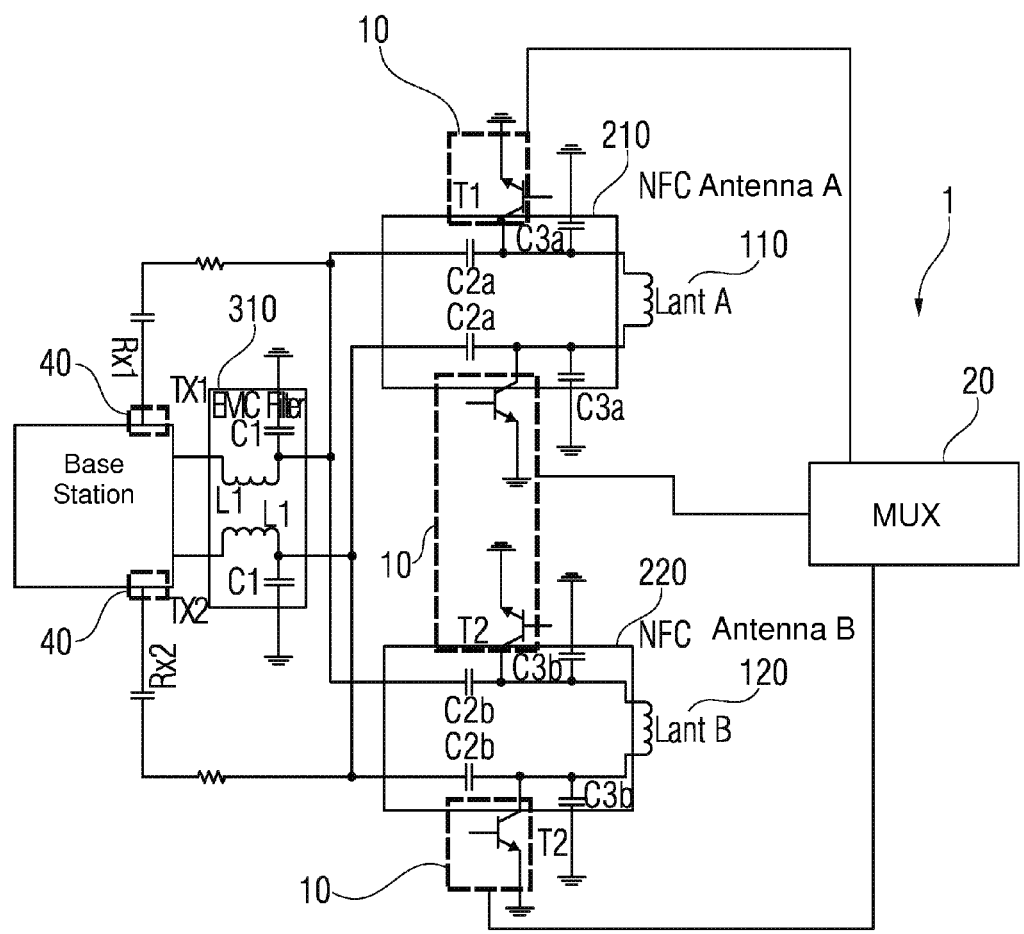
FIG. 1 shows a schematic illustration of an apparatus for operating at least two antennas for a motor vehicle according to an exemplary embodiment of the invention.

Referring now to the figures of the drawing in detail and first, particularly, to FIG. 1 thereof, there is shown an apparatus for operating at least two antennas for a motor vehicle according to a further embodiment of the present invention.

An apparatus 1 for operating at least two antennas 110, 120, 130 comprises a switching device 10 and a multiplexing device (MUX) 20, for example.

The switching device 10 can be coupled to the at least two antennas 110, 120, 130 and perform at least one switching process and use the switching process to change a respective input capacitance for one of the at least two antennas 110, 120, 130, for example.

The switching device 10 can be coupled to an EMC filter 310 and via matching networks 210, 220, 230 to a plurality of antennas 110, 120, 130, for example.

The antennas 110, 120, 130 therefore each have at least two input capacitances facilitated by the matching networks, and it is advantageously possible to switch to and fro between the two input capacitances by virtue of a switching process in the switching device 10.

This switching process for changing the input capacitance of an antenna can take place independently, but advantageously in advance of a changeover from a first antenna 110, 120, 130 having a first input capacitance to a second antenna 110, 120, 130 having a second input capacitance.

In addition, changing of the first input capacitance and/or the second input capacitance allows a change in the capacitance of the antenna used to be decreased when the antennas are changed over, for example.

In addition, the multiplexing device 20 may be designed to select one of the at least two antennas for near field communication and to connect it to an output 40 of the apparatus 1, for example.

In addition, the multiplexing device 20 and the switching device 10 may be designed so that, when changing over from a first antenna 110, 120, 130 having a first input capacitance to a second antenna 110, 120, 130 having a second input capacitance, they match the second input capacitance to the first input capacitance by performing the switching process.

By way of example, the antenna 110, also referred to as NFC antenna A in FIG. 1, may be active—can be used for sending and/or receiving signals—and application of a voltage to the base of T2 in the switching device 10 connects the series capacitances C2$b$ to ground. In this case, the capacitance of C2$b$ is added to C1, for example. The base of the transistor T1 is at ground potential, for example.

By way of example, the antenna 120, also referred to as NFC antenna B in FIG. 1, may be active—can be used for sending and/or receiving signals—and application of a voltage to the base of T1 now connects the series capacitances C2$a$ in the antenna path A to ground. The capacitance of C2$a$ is added to C1, for example. The base of the transistor T2 is at ground potential, for example.

Figure 2:
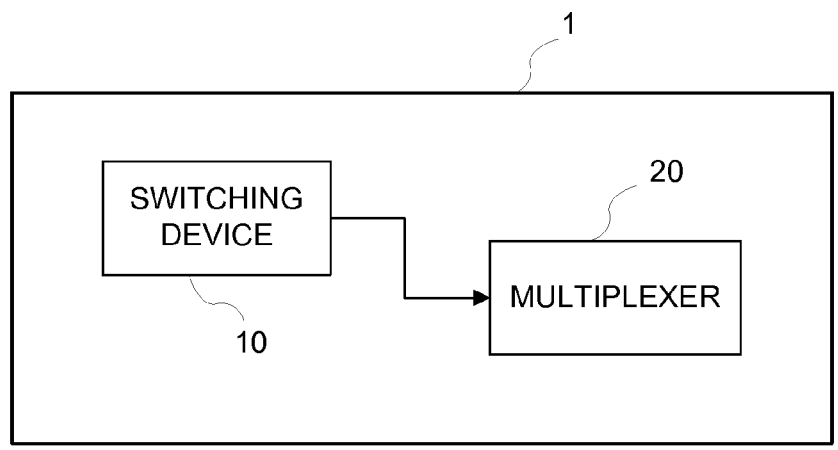
FIG. 2 shows a schematic illustration of an apparatus for operating at least two antennas for a motor vehicle according to a further embodiment of the present invention.

FIG. 2 shows an apparatus for operating at least two antennas for a motor vehicle according to a further embodiment of the present invention.

An apparatus 1 for operating at least two antennas comprises a switching device 10 and a multiplexing device 20, for example.

Figure 3:
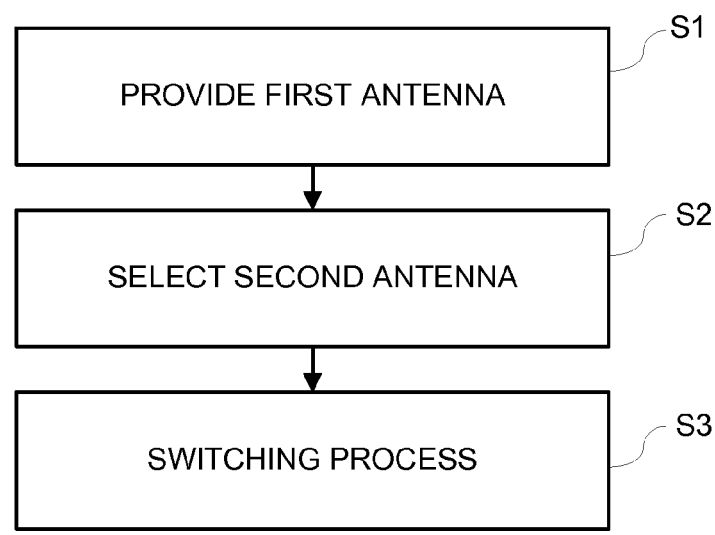
FIG. 3 shows a schematic illustration of a flowchart for a method for operating at least two antennas for a motor vehicle according to a further embodiment of the present invention.

FIG. 3 shows a flowchart for a method for operating at least two antennas for a motor vehicle according to a further embodiment of the present invention.

As a first step in the method, a first antenna from the at least two antennas is provided S1 as the currently connected antenna, for example, the first antenna having a first input capacitance.

As a second step in the method, a second antenna from the at least two antennas is selected S2 as the imminently connected antenna, for example.

As a third step in the method, a switching process is performed S3, for example, wherein a second input capacitance of the second antenna is matched to the first input capacitance of the first antenna and the first antenna is changed over to the second antenna.

Figure 4:
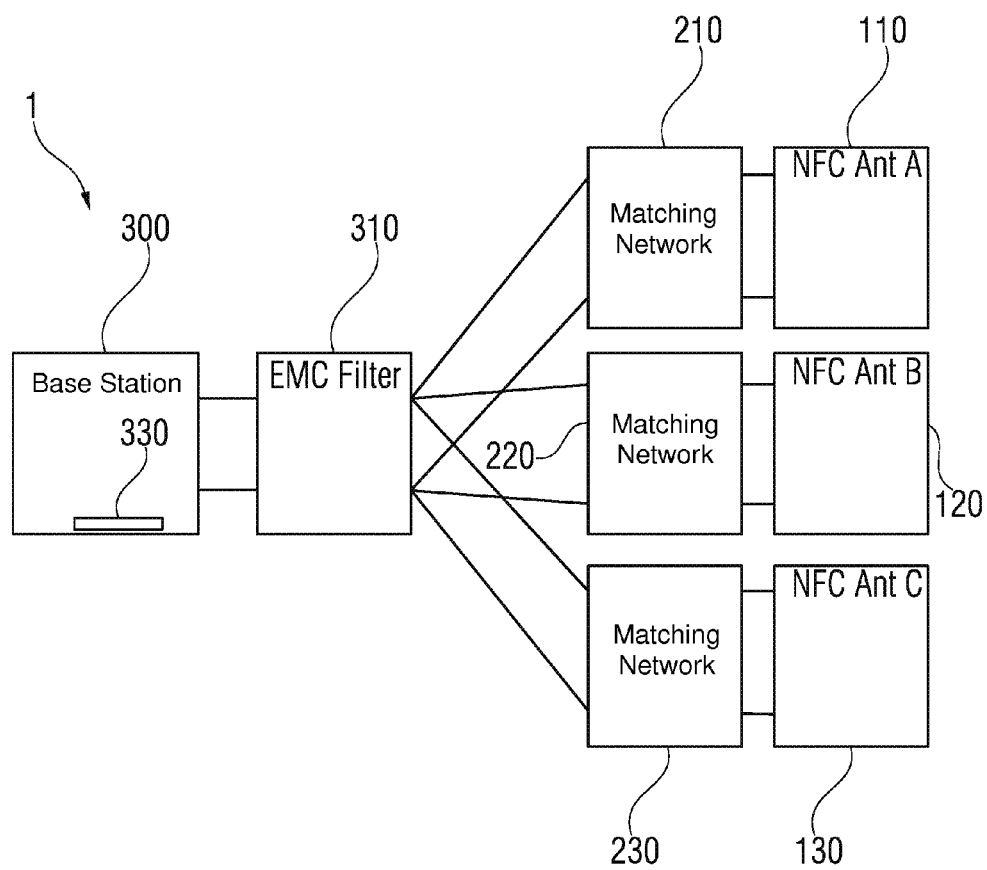
FIG. 4 shows a schematic illustration of an apparatus for operating at least two antennas for a motor vehicle according to a further embodiment of the present invention.

FIG. 4 shows a near field communication network for a motor vehicle according to a further embodiment of the present invention.

A transceiver base station 300 equipped with just one NFC transceiver IC comprises a transceiver 330, for example.

The term "transceiver" is a composite referring to a combination of "transmitter" and "receiver."

For example, the transceiver base station 300 is coupled to a plurality of antennas 110, 120, 130 via an EMC filter 310 and matching networks 210, 220, 230.

The matching networks 210, 220, 230 may be provided for capacitive matching or for power or impedance matching.

By way of example, the EMC filter 310 comprises a coil L1 and a capacitance C1. The cut-off frequency is chosen to be approximately fco=15.5 MHz.

By way of example, the NFC antennas 110, 120, 130 have a similar inductance, similar inductance in this context meaning differences of less than 40% with regard to the respective inductance of different antennas, for example.

C1 is chosen such that C1 total=C1+C2(*a/b*), for example, and C2*a* corresponds approximately to C2*b*, corresponding approximately in this context meaning a difference of approximately +/−20% between C2*a* and C2*b*, for example.

The further reference symbols shown in FIG. 4 have already been explained in the descriptions of the figures associated with FIGS. 1 and 2 and are therefore not explained further.

Although the present invention has been described using preferred exemplary embodiments above, it is not limited thereto but rather can be modified in a wide variety of ways. In particular, the invention can be altered or modified in diverse ways without departing from the essence of the invention.

It will be understood that the terms "comprising" and "having" do not exclude any other elements or steps and "a" or "an" does not exclude a plurality or multiplicity.

In addition, it should be pointed out that features or steps that have been described with reference to one of the above exemplary embodiments can also be used in combination with other features of steps of other exemplary embodiments described above.

The invention claimed is:

1. An apparatus for operating at least two separately disposed and independent near-field communications (NFC) antennas of a motor vehicle, the apparatus comprising:
   a switching device to be coupled to the at least two separately disposed and independent NFC antennas and configured to perform a switching process and to use the switching process to change a respective input capacitance of one antenna of the at least two antennas;
   a multiplexing device connected to said switching device, said multiplexing device being configured to select one of the at least two antennas for near field communication and to connect the selected antenna to an output; and
   said multiplexing device and said switching device being configured, when changing over from a first antenna having a first input capacitance to a second antenna having a second input capacitance, to match the second input capacitance to the first input capacitance by performing the switching process.

2. The apparatus according to claim 1, wherein said switching device has a bipolar transistor.

3. The apparatus according to claim 1, wherein said switching device is configured to connect a series capacitance of one of the at least two antennas to ground in the switching process.

4. The apparatus according to claim 1, which further comprises a near field communication base station configured to operate the at least two antennas on a transceiver.

5. The apparatus according to claim 1, configured to operate the at least two antennas for near field communication in a frequency range from 10 to 20 MHz.

6. The apparatus according to claim 5, wherein the frequency range is from 12 to 17 MHz.

7. The apparatus according to claim 5, wherein the frequency range is from 13.56 to 15.5 MHz.

8. The apparatus according to claim 1, which further comprises a matching network to be coupled to the at least two antennas.

9. A near field communication network for a motor vehicle, the network comprising at least two separately disposed, independent near-field communications (NFC) antennas and an apparatus according to claim 1 connected to said at least two NFC antennas.

10. A method of operating at least two separately disposed near-field communications (NFC) antennas for a motor vehicle, the method comprising the following method steps:
    providing a first antenna from the at least two separately disposed NFC antennas as a currently connected antenna, the first antenna having a first input capacitance;
    selecting a second antenna from the at least two antennas as the antenna to be imminently connected; and
    performing a switching process, wherein a second input capacitance of the second antenna is matched to the first input capacitance of the first antenna, and effecting a changeover from the first antenna to the second antenna.

* * * * *